US009824999B2

(12) United States Patent
Crane et al.

(10) Patent No.: US 9,824,999 B2
(45) Date of Patent: Nov. 21, 2017

(54) SEMICONDUCTOR DIE MOUNT BY CONFORMAL DIE COATING

(71) Applicant: Invensas Corporation, San Jose, CA (US)

(72) Inventors: Scott Jay Crane, Aromas, CA (US); Simon J. S. McElrea, Scotts Valley, CA (US); Scott McGrath, Scotts Valley, CA (US); Weiping Pan, San Jose, CA (US); De Ann Eileen Melcher, San Jose, CA (US); Marc E. Robinson, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/969,779

(22) Filed: Dec. 15, 2015

(65) Prior Publication Data

US 2016/0104689 A1 Apr. 14, 2016

Related U.S. Application Data

(62) Division of application No. 14/242,206, filed on Apr. 1, 2014, now Pat. No. 9,252,116, which is a division
(Continued)

(51) Int. Cl.
*H01L 23/00* (2006.01)
*H01L 25/065* (2006.01)
*H01L 23/29* (2006.01)

(52) U.S. Cl.
CPC ............ *H01L 24/83* (2013.01); *H01L 23/293* (2013.01); *H01L 24/24* (2013.01); *H01L 24/27* (2013.01);
(Continued)

(58) Field of Classification Search
CPC ....... H01L 25/105; H01L 25/65; H01L 25/03; H01L 25/0657
See application file for complete search history.

(56) References Cited

U.S. PATENT DOCUMENTS 4,323,914 A 4/1982 Berndlmaier et al.
4,336,551 A 6/1982 Fujita et al.
(Continued)

FOREIGN PATENT DOCUMENTS

CN 2512114 Y 9/2002
CN 1531069 A 9/2004
(Continued)

OTHER PUBLICATIONS

International Search Report for PCT Application No. PCT/US2008/065793, dated Dec. 22, 2008 (dated Dec. 22, 2008).
(Continued)

*Primary Examiner* — Yu-Hsi D Sun

(57) ABSTRACT

A conformal coating on a semiconductor die provides adhesion between the die and a support. No additional adhesive is necessary to affix the die on the support. The conformal coating protects the die during assembly, and serves to electrically insulate the die from electrically conductive parts that the die may contact. The conformal coating may be an organic polymer, such as a parylene, for example. Also, a method for adhering a die onto a support, which may optionally be another die, includes providing a coating of a conformal between the die and the support, and heating the coating between the die and the support. The conformal coating may be provided on a die attach area of a surface of the die, or on a die mount region of a surface of the support, or on both a die attach area of a surface of the die and on a
(Continued)

die mount region of a surface of the support; and the conformal coating may be provided following placement of the die on the support.

17 Claims, 5 Drawing Sheets

Related U.S. Application Data of application No. 12/199,080, filed on Aug. 27, 2008, now Pat. No. 8,704,379.

(60) Provisional application No. 60/971,203, filed on Sep. 10, 2007.

(52) U.S. Cl.
CPC .......... *H01L 25/0657* (2013.01); *H01L 24/73* (2013.01); *H01L 2224/24145* (2013.01); *H01L 2224/24146* (2013.01); *H01L 2224/27452* (2013.01); *H01L 2224/32145* (2013.01); *H01L 2224/32225* (2013.01); *H01L 2224/32245* (2013.01); *H01L 2224/48227* (2013.01); *H01L 2224/48247* (2013.01); *H01L 2224/48465* (2013.01); *H01L 2224/73265* (2013.01); *H01L 2224/8385* (2013.01); *H01L 2224/92247* (2013.01); *H01L 2225/0651* (2013.01); *H01L 2225/06524* (2013.01); *H01L 2225/06551* (2013.01); *H01L 2924/01005* (2013.01); *H01L 2924/01006* (2013.01); *H01L 2924/01013* (2013.01); *H01L 2924/01033* (2013.01); *H01L 2924/01038* (2013.01); *H01L 2924/01082* (2013.01); *H01L 2924/12042* (2013.01); *H01L 2924/14* (2013.01)

(56) References Cited

U.S. PATENT DOCUMENTS

| | | | |
|---|---|---|---|
| 4,363,076 A | 12/1982 | McIver | |
| 4,500,905 A | 2/1985 | Shibata | |
| 4,784,972 A | 11/1988 | Hatada | |
| 5,107,325 A | 4/1992 | Nakayoshi | |
| 5,138,438 A | 8/1992 | Masayuki et al. | |
| 5,200,362 A | 4/1993 | Lin et al. | |
| 5,218,234 A | 6/1993 | Thompson et al. | |
| 5,311,401 A | 5/1994 | Gates, Jr. et al. | |
| 5,331,591 A | 7/1994 | Clifton | |
| 5,334,872 A | 8/1994 | Ueda et al. | |
| 5,434,745 A | 7/1995 | Shokrgozar et al. | |
| 5,466,634 A | 11/1995 | Beilstein, Jr. et al. | |
| 5,538,758 A | 7/1996 | Beach et al. | |
| 5,571,754 A | 11/1996 | Bertin et al. | |
| 5,616,953 A | 4/1997 | King et al. | |
| 5,629,566 A | 5/1997 | Doi et al. | |
| 5,675,180 A | 10/1997 | Pedersen et al. | |
| 5,691,248 A | 11/1997 | Cronin et al. | |
| 5,698,895 A | 12/1997 | Pedersen et al. | |
| 5,716,759 A | 2/1998 | Badehi | |
| 5,721,151 A | 2/1998 | Padmanabhan et al. | |
| 5,731,631 A | 3/1998 | Yama et al. | |
| 5,737,191 A | 4/1998 | Horiuchi et al. | |
| 5,870,351 A | 2/1999 | Ladabaum et al. | |
| 5,879,965 A | 3/1999 | Jiang et al. | |
| 5,891,753 A * | 4/1999 | Akram ................. | H01L 21/563 257/E21.503 |
| 5,891,761 A | 4/1999 | Vindasius et al. | |
| 5,910,687 A | 6/1999 | Chen et al. | |
| 5,946,545 A | 8/1999 | Bertin et al. | |
| 5,965,947 A | 10/1999 | Nam et al. | |
| 6,030,854 A | 2/2000 | Mashimoto et al. | |
| 6,034,438 A | 3/2000 | Petersen | |
| 6,087,716 A | 7/2000 | Ikeda | |
| 6,107,164 A | 8/2000 | Ohuchi | |
| 6,175,158 B1 | 1/2001 | Degani et al. | |
| 6,225,689 B1 | 5/2001 | Moden et al. | |
| 6,228,686 B1 | 5/2001 | Smith et al. | |
| 6,255,726 B1 | 7/2001 | Vindasius et al. | |
| 6,262,476 B1 | 7/2001 | Vidal | |
| 6,271,598 B1 | 8/2001 | Vindasius et al. | |
| 6,297,657 B1 | 10/2001 | Thiessen et al. | |
| 6,303,977 B1 | 10/2001 | Schroen et al. | |
| 6,315,856 B1 | 11/2001 | Asagiri et al. | |
| 6,326,244 B1 | 12/2001 | Brooks et al. | |
| 6,326,689 B1 | 12/2001 | Thomas | |
| 6,338,980 B1 | 1/2002 | Satoh | |
| 6,351,030 B2 | 2/2002 | Havens et al. | |
| 6,472,746 B2 | 10/2002 | Taniguchi et al. | |
| 6,476,467 B2 | 11/2002 | Nakamura et al. | |
| 6,569,709 B2 | 5/2003 | Derderian | |
| D475,981 S | 6/2003 | Michii | |
| 6,580,165 B1 | 6/2003 | Singh | |
| 6,582,992 B2 | 6/2003 | Poo et al. | |
| 6,593,648 B2 | 7/2003 | Emoto | |
| 6,607,938 B2 | 8/2003 | Kwon et al. | |
| 6,607,941 B2 | 8/2003 | Prabhu et al. | |
| 6,621,155 B1 | 9/2003 | Perino et al. | |
| 6,621,172 B2 | 9/2003 | Nakayama et al. | |
| 6,624,505 B2 | 9/2003 | Badehi | |
| 6,656,827 B1 | 12/2003 | Tsao et al. | |
| 6,667,543 B1 | 12/2003 | Chow et al. | |
| 6,670,701 B2 | 12/2003 | Matsuura et al. | |
| 6,674,159 B1 | 1/2004 | Peterson et al. | |
| 6,686,655 B2 | 2/2004 | Moden et al. | |
| 6,706,971 B2 | 3/2004 | Albert et al. | |
| 6,722,213 B2 | 4/2004 | Offen et al. | |
| 6,730,997 B2 | 5/2004 | Beyne et al. | |
| 6,737,743 B2 | 5/2004 | Urakawa | |
| 6,747,348 B2 | 6/2004 | Jeung et al. | |
| 6,750,547 B2 | 6/2004 | Jeung et al. | |
| 6,756,252 B2 | 6/2004 | Nakanishi | |
| 6,777,767 B2 | 8/2004 | Badehi | |
| 6,802,446 B2 | 10/2004 | Chaudhuri et al. | |
| 6,844,623 B1 | 1/2005 | Peterson et al. | |
| 6,849,802 B2 | 2/2005 | Song et al. | |
| 6,908,784 B1 | 6/2005 | Farnworth et al. | |
| 6,910,268 B2 | 6/2005 | Miller | |
| 6,940,022 B1 | 9/2005 | Vinciarelli et al. | |
| 6,956,283 B1 | 10/2005 | Peterson | |
| 6,964,915 B2 | 11/2005 | Farnworth et al. | |
| 6,972,480 B2 | 12/2005 | Zilber et al. | |
| 6,973,718 B2 | 12/2005 | Sheppard, Jr. et al. | |
| 6,984,885 B1 | 1/2006 | Harada et al. | |
| 7,005,324 B2 | 2/2006 | Imai | |
| 7,029,949 B2 | 4/2006 | Farnworth et al. | |
| 7,061,125 B2 | 6/2006 | Cho et al. | |
| 7,115,986 B2 | 10/2006 | Moon et al. | |
| 7,180,168 B2 | 2/2007 | Imai | |
| 7,190,060 B1 | 3/2007 | Chiang | |
| 7,196,262 B2 | 3/2007 | Gronet | |
| 7,208,335 B2 | 4/2007 | Boon et al. | |
| 7,208,345 B2 | 4/2007 | Meyer et al. | |
| 7,215,018 B2 | 5/2007 | Vindasius et al. | |
| 7,221,051 B2 | 5/2007 | Ono et al. | |
| 7,245,021 B2 | 7/2007 | Vindasius et al. | |
| 7,259,455 B2 | 8/2007 | Seto | |
| 7,279,363 B2 | 10/2007 | Cherukuri et al. | |
| 7,285,865 B2 | 10/2007 | Kwon et al. | |
| 7,335,533 B2 | 2/2008 | Derderian | |
| 7,355,274 B2 | 4/2008 | Lim | |
| 7,358,154 B2 | 4/2008 | Poo et al. | |
| 7,405,138 B2 | 7/2008 | Ohuchi et al. | |
| 7,408,243 B2 | 8/2008 | Shiffer | |
| 7,452,743 B2 | 11/2008 | Oliver et al. | |
| 7,514,350 B2 | 4/2009 | Hashimoto | |
| 7,521,288 B2 | 4/2009 | Arai et al. | |
| 7,535,109 B2 | 5/2009 | Robinson et al. | |
| 7,564,142 B2 | 7/2009 | Hashimoto | |
| 7,595,222 B2 | 9/2009 | Shimoishizaka et al. | |
| 7,601,039 B2 | 10/2009 | Eldridge et al. | |
| 7,638,869 B2 | 12/2009 | Irsigler et al. | |
| 7,662,670 B2 | 2/2010 | Noma et al. | |

(56) References Cited

U.S. PATENT DOCUMENTS

| | | |
|---|---|---|
| 7,662,671 B2 | 2/2010 | Saeki |
| 7,704,794 B2 | 4/2010 | Mess et al. |
| 7,732,912 B2 | 6/2010 | Damberg |
| 7,768,795 B2 | 8/2010 | Sakurai et al. |
| 7,829,438 B2 | 11/2010 | Haba et al. |
| 7,863,159 B2 | 1/2011 | Co et al. |
| 7,888,185 B2 | 2/2011 | Corisis et al. |
| 7,901,989 B2 | 3/2011 | Haba et al. |
| 7,919,846 B2 | 4/2011 | Hembree |
| 7,923,349 B2 | 4/2011 | McElrea et al. |
| 7,952,195 B2 | 5/2011 | Haba |
| 8,022,527 B2 | 9/2011 | Haba et al. |
| 8,076,788 B2 | 12/2011 | Haba et al. |
| 8,178,978 B2 | 5/2012 | McElrea et al. |
| 2001/0012725 A1 | 8/2001 | Maeda et al. |
| 2001/0031548 A1 | 10/2001 | Elenius et al. |
| 2001/0042906 A1 | 11/2001 | Nakamura et al. |
| 2002/0006686 A1 | 1/2002 | Cloud et al. |
| 2002/0027257 A1 | 3/2002 | Kinsman et al. |
| 2002/0045290 A1 | 4/2002 | Ball |
| 2002/0096349 A1 | 7/2002 | Hedler et al. |
| 2002/0127775 A1 | 9/2002 | Haba et al. |
| 2002/0168798 A1 | 11/2002 | Glenn et al. |
| 2002/0180010 A1 | 12/2002 | Tsubosaki et al. |
| 2002/0185725 A1 | 12/2002 | Moden et al. |
| 2002/0187260 A1 | 12/2002 | Sheppard et al. |
| 2002/0190368 A1 | 12/2002 | Shimoe et al. |
| 2003/0038353 A1 | 2/2003 | Derderian |
| 2003/0038356 A1 | 2/2003 | Derderian |
| 2003/0038357 A1* | 2/2003 | Derderian ........... H01L 23/3128 257/686 |
| 2003/0060034 A1 | 3/2003 | Beyne et al. |
| 2003/0071338 A1 | 4/2003 | Jeung et al. |
| 2003/0071341 A1 | 4/2003 | Jeung et al. |
| 2003/0080403 A1 | 5/2003 | Jeung et al. |
| 2003/0092326 A1 | 5/2003 | Nishikawa et al. |
| 2003/0096454 A1 | 5/2003 | Poo et al. |
| 2003/0099085 A1 | 5/2003 | Duva |
| 2003/0122243 A1 | 7/2003 | Lee et al. |
| 2003/0143819 A1 | 7/2003 | Hedler et al. |
| 2003/0148597 A1 | 8/2003 | Tan et al. |
| 2003/0162369 A1 | 8/2003 | Kobayashi |
| 2003/0209772 A1 | 11/2003 | Prabhu |
| 2004/0014309 A1 | 1/2004 | Nakanishi |
| 2004/0113283 A1 | 6/2004 | Farnworth et al. |
| 2004/0142509 A1 | 7/2004 | Imai |
| 2004/0150095 A1 | 8/2004 | Fraley et al. |
| 2004/0173892 A1 | 9/2004 | Nakanishi |
| 2004/0195667 A1 | 10/2004 | Karnezos |
| 2004/0198033 A1 | 10/2004 | Lee et al. |
| 2004/0212083 A1 | 10/2004 | Yang |
| 2004/0217446 A1 | 11/2004 | Headley et al. |
| 2004/0227235 A1 | 11/2004 | Hashimoto |
| 2004/0238933 A1 | 12/2004 | Chen et al. |
| 2004/0251520 A1 | 12/2004 | Sasaki et al. |
| 2004/0262035 A1 | 12/2004 | Ko et al. |
| 2005/0013927 A1 | 1/2005 | Yamazaki |
| 2005/0067680 A1 | 3/2005 | Boon et al. |
| 2005/0067694 A1 | 3/2005 | Pon et al. |
| 2005/0082651 A1 | 4/2005 | Farnworth et al. |
| 2005/0085050 A1 | 4/2005 | Draney et al. |
| 2005/0101039 A1 | 5/2005 | Chen et al. |
| 2005/0104179 A1 | 5/2005 | Zilber et al. |
| 2005/0148160 A1 | 7/2005 | Farnworth et al. |
| 2005/0156323 A1 | 7/2005 | Tokunaga |
| 2005/0230802 A1 | 10/2005 | Vindasius et al. |
| 2005/0248021 A1 | 11/2005 | Morkner |
| 2005/0258530 A1 | 11/2005 | Vindasius et al. |
| 2005/0287705 A1 | 12/2005 | Yang |
| 2005/0287709 A1 | 12/2005 | Lee et al. |
| 2006/0003552 A1 | 1/2006 | Okada |
| 2006/0035408 A1 | 2/2006 | Derderian |
| 2006/0046436 A1 | 3/2006 | Ohuchi et al. |
| 2006/0055050 A1 | 3/2006 | Numata et al. |
| 2006/0068567 A1 | 3/2006 | Beyne et al. |
| 2006/0076690 A1 | 4/2006 | Khandros et al. |
| 2006/0094165 A1 | 5/2006 | Hedler et al. |
| 2006/0097356 A1 | 5/2006 | Fujii et al. |
| 2006/0103000 A1 | 5/2006 | Kurosawa |
| 2006/0121645 A1 | 6/2006 | Ball |
| 2006/0138626 A1 | 6/2006 | Liew et al. |
| 2006/0220262 A1 | 10/2006 | Meyer et al. |
| 2006/0252180 A1 | 11/2006 | Moden et al. |
| 2006/0267173 A1 | 11/2006 | Takiar et al. |
| 2006/0273365 A1 | 12/2006 | Cross et al. |
| 2006/0278971 A1 | 12/2006 | Barnes et al. |
| 2007/0023900 A1 | 2/2007 | Toyoda |
| 2007/0029684 A1 | 2/2007 | Arai et al. |
| 2007/0065987 A1 | 3/2007 | Mess et al. |
| 2007/0102801 A1 | 5/2007 | Ishida et al. |
| 2007/0132082 A1 | 6/2007 | Tang et al. |
| 2007/0158799 A1 | 7/2007 | Chiu et al. |
| 2007/0158807 A1 | 7/2007 | Lu et al. |
| 2007/0170572 A1 | 7/2007 | Liu et al. |
| 2007/0181989 A1 | 8/2007 | Corisis et al. |
| 2007/0187811 A1 | 8/2007 | Arai et al. |
| 2007/0194462 A1 | 8/2007 | Kim et al. |
| 2007/0222054 A1 | 9/2007 | Hembree |
| 2007/0252262 A1 | 11/2007 | Robinson et al. |
| 2007/0284716 A1 | 12/2007 | Vindasius et al. |
| 2008/0083976 A1 | 4/2008 | Haba et al. |
| 2008/0083977 A1 | 4/2008 | Haba et al. |
| 2008/0112150 A1 | 5/2008 | Jones |
| 2008/0150158 A1 | 6/2008 | Chin |
| 2008/0166836 A1 | 7/2008 | Jobetto |
| 2008/0173792 A1 | 7/2008 | Yang et al. |
| 2008/0180242 A1 | 7/2008 | Cottingham |
| 2008/0203566 A1 | 8/2008 | Su |
| 2008/0206915 A1 | 8/2008 | Yamazaki |
| 2008/0208043 A1 | 8/2008 | Smith et al. |
| 2008/0251913 A1 | 10/2008 | Inomata |
| 2008/0251939 A1 | 10/2008 | Chung et al. |
| 2008/0284044 A1 | 11/2008 | Myers |
| 2008/0290493 A1 | 11/2008 | Tsunozaki |
| 2008/0303131 A1 | 12/2008 | McElrea et al. |
| 2008/0308921 A1 | 12/2008 | Kim |
| 2008/0315407 A1 | 12/2008 | Andrews, Jr. et al. |
| 2009/0020887 A1 | 1/2009 | Mizuno et al. |
| 2009/0020889 A1 | 1/2009 | Murayama et al. |
| 2009/0065948 A1 | 3/2009 | Wang |
| 2009/0068790 A1 | 3/2009 | Caskey et al. |
| 2009/0102038 A1 | 4/2009 | McElrea et al. |
| 2009/0146137 A1 | 6/2009 | Kim et al. |
| 2009/0160065 A1 | 6/2009 | Haba et al. |
| 2009/0230528 A1 | 9/2009 | McElrea et al. |
| 2009/0316378 A1 | 12/2009 | Haba et al. |
| 2010/0140753 A1 | 6/2010 | Hembree |
| 2010/0140811 A1 | 6/2010 | Leal et al. |
| 2010/0148352 A1 | 6/2010 | Moden |
| 2010/0207277 A1 | 8/2010 | Bauer et al. |
| 2010/0327461 A1 | 12/2010 | Co et al. |
| 2011/0006432 A1 | 1/2011 | Haba et al. |
| 2011/0031629 A1 | 2/2011 | Haba et al. |
| 2011/0033979 A1 | 2/2011 | Haba et al. |
| 2011/0049696 A1 | 3/2011 | Haba et al. |
| 2011/0187007 A1 | 8/2011 | Haba et al. |
| 2011/0248410 A1 | 10/2011 | Avsian et al. |
| 2011/0266684 A1 | 11/2011 | Leal |
| 2012/0061846 A1 | 3/2012 | Rathburn |
| 2012/0080807 A1 | 4/2012 | Haba et al. |
| 2012/0133057 A1 | 5/2012 | Haba et al. |
| 2012/0211878 A1 | 8/2012 | Popovic et al. |
| 2013/0099392 A1 | 4/2013 | McElrea et al. |
| 2013/0119542 A1 | 5/2013 | Oh |
| 2013/0154117 A1 | 6/2013 | Tan et al. |

FOREIGN PATENT DOCUMENTS

| | | |
|---|---|---|
| CN | 1638118 A | 7/2005 |
| CN | 1905148 A | 1/2007 |
| DE | 102004039906 A1 | 8/2005 |
| EP | 1041624 A1 | 10/2000 |
| EP | 1763894 A2 | 3/2007 |
| FR | 2704690 A1 | 11/1994 |

(56) References Cited

FOREIGN PATENT DOCUMENTS

| | | |
|---|---|---|
| JP | 07-509104 A | 10/1995 |
| JP | 11-260851 A | 9/1999 |
| JP | 2000269411 A | 9/2000 |
| JP | 2001210782 A | 8/2001 |
| JP | 2003-142518 A | 5/2003 |
| JP | 2003163324 A | 6/2003 |
| JP | 2004-119473 | 4/2004 |
| JP | 2004153130 A | 5/2004 |
| JP | 2004158536 A | 6/2004 |
| JP | 2004-214548 A | 7/2004 |
| JP | 2005005529 A | 1/2005 |
| JP | 2005026564 A | 1/2005 |
| JP | 2006-351793 A | 12/2006 |
| JP | 2007073803 A | 3/2007 |
| JP | 2007523482 A | 8/2007 |
| JP | 2008160119 A | 7/2008 |
| JP | 2008205453 A | 9/2008 |
| JP | 2008236688 A | 10/2008 |
| JP | 2009-026969 | 2/2009 |
| JP | 2009027039 A | 2/2009 |
| KR | 20-1994-0004952 | 7/1994 |
| KR | 10-1999-0008537 | 2/1999 |
| KR | 20010062722 A | 7/2001 |
| KR | 20050009036 A | 1/2005 |
| KR | 20070018057 A | 2/2007 |
| KR | 100813624 B1 | 3/2008 |
| KR | 20080045259 A | 5/2008 |
| KR | 20080069549 A | 7/2008 |
| KR | 20080091980 | 10/2008 |
| TW | 475244 | 2/2002 |
| TW | 200425356 A | 11/2004 |
| TW | 200504995 A | 2/2005 |
| TW | 200527549 A | 8/2005 |
| TW | 200538754 A | 12/2005 |
| TW | 200605298 A | 2/2006 |
| TW | 200721471 | 6/2007 |
| TW | 200913208 A | 3/2009 |
| TW | 200940570 A | 10/2009 |
| WO | 9425987 A1 | 11/1994 |
| WO | 9907015 A1 | 2/1999 |
| WO | 9909599 A2 | 2/1999 |
| WO | 0164344 A2 | 9/2001 |
| WO | 2005081315 A2 | 9/2005 |
| WO | 2005101492 A2 | 10/2005 |
| WO | 2009032371 A1 | 3/2009 |
| WO | 2009052150 A1 | 4/2009 |
| WO | 2009114670 A2 | 9/2009 |

OTHER PUBLICATIONS

International Search Report and Written Opinion for PCT Application No. PCT/US2008/065788, dated Sep. 30, 2008 (dated Sep. 30, 2008).
International Search Report & Written Opinion, Application N90. PCT/US2008/066561, dated Dec. 31, 2008.
Office Action (Restriction) dated May 24, 2010, U.S. Appl. No. 12/124,097 D.
Amendment filed Jul. 26, 2010 in response to May 24, 2010 Office Action, U.S. Appl. No. 12/124,097 D.
Office Action dated Oct. 14, 2010, U.S. Appl. No. 12/124,097 D.
Amendment filed Feb. 14, 2011 in response to Oct. 14, 2010 Office Action, U.S. Appl. No. 12/124,097 D.
Notice of Allowability, dated Oct. 19, 2006, U.S. Appl. No. 11/090,969 D.
Office Action (Restriction) dated Apr. 20, 2009, U.S. Appl. No. 11/744,142 D.
Amendment filed May 22, 2009 in response to Apr. 20, 2009 Office Action, U.S. Appl. No. 11/744,142 D.
Office Action dated Aug. 3, 2009, U.S. Appl. No. 11/744,142 D.
Amendment filed Dec. 3, 2009 in response to 813109 Office Action, U.S. Appl. No. 11/744,142 D.
Final Office Action dated Mar. 18, 2010, U.S. Appl. No. 11/744,142 D.
Notice of Appeal filed Sep. 16, 2010 in response to Mar. 18, 2010 Office Action, U.S. Appl. No. 11/744,142 D.
Amendment and RCE filed Mar. 16, 2011 in response to Mar. 18, 2010 Office Action, U.S. Appl. No. 11/744,142 D.
Office Action mailed 217106, U.S. Appl. No. 11/097,829 D.
Amendment A filed Aug. 7, 2006 in response to Feb. 7, 2006 Office Action, U.S. Appl. No. 11/097,829 D.
Final Office Action mailed 118/07, U.S. Appl. No. 11/097,829 D.
Amendment filed Jan. 24, 2007 in response to Jan. 8, 2007 Office Action, U.S. Appl. No. 11/097,829 D.
Notice of Allowance, dated Feb. 12, 2007, U.S. Appl. No. 11/097,829 D.
Notice to File Corrected Papers, dated Mar. 30, 2007, U.S. Appl. No. 11/097,829 0.
Amendment filed May 29, 2007 in response to Mar. 30, 2007 Notice, U.S. Appl. No. 11/097,829 0.
EP Supplementary Search Report dated Jun. 5, 2008 and dated Jun. 12, 2008 for EP App. No. 05735136.3.
Office Action dated Dec. 31, 2007, U.S. Appl. No. 11/744,153 0.
Amendment filed 4/1108 in response to Dec. 31, 2007 Office Action, U.S. Appl. No. 11/744,153 0.
Final Office Action dated Jul. 1, 3010, U.S. Appl. No. 11/744,153 0.
Amendment filed 10/1108 in response to Jul. 1, 2010 Office Action, U.S. Appl. No. 11/744,153 0.
Advisory Action, dated Oct. 20, 2008, U.S. Appl. No. 11/744,153 0.
Amendment and RCE filed Nov. 26, 2008 in response to Oct. 20, 2008 Advisory Action, U.S. Appl. No. 11/744,153 0.
Notice of Allowance dated Feb. 27, 2009, U.S. Appl. No. 11/744,153 0.
Office Action (Restriction) dated Oct. 7, 2009, U.S. Appl. No. 12/143,157 0.
Amendment filed Nov. 9, 2009 in response to Oct. 7, 2009 Office Action, U.S. Appl. No. 12/143,157 0.
Office Action dated Dec. 30, 2009, U.S. Appl. No. 12/143,157 0.
Amendment filed Jun. 30, 2009 in response to Dec. 30, 2009 Office Action, U.S. Appl. No. 12/143,157 0.
Final Office Action, dated Aug. 5, 2010, U.S. Appl. No. 12/143,157 0.
Amendment and RCE filed Feb. 7, 2011 in repsonse to Aug. 5, 2010 Office Action, U.S. Appl. No. 12/143,157 0.
Office Action dated Mar. 1, 2011, U.S. Appl. No. 12/143,157 0.
International Search Report and Wrillen Opinion, Appl. No. PCT/US2008/067722, dated Feb. 25, 2009.
Office Action (Restriction) dated Feb. 4, 2010, U.S. Appl. No. 12/251,624 0.
Amendment filed Mar. 4, 2010 in response to Feb. 4, 2010 Office Action, U.S. Appl. No. 12/251,624 0.
Office Action dated Jun. 9, 2010, U.S. Appl. No. 12/251,624 0.
Amendment filed Dec. 9, 2010 in response to Jun. 9, 2010 Office Action, U.S. Appl. No. 12/251,624 0.
Final Office Action dated Mar. 1, 2011, U.S. Appl. No. 12/251,624 0.
International Search Report and Written Opinion dated Mar. 17, 2009, App. No. PCT/US2008/079948.
International Search Report and Written Opinion dated Mar. 6, 2009, App. No. PCT/US2008/173365 0.
Office Action (Restriction) dated Dec. 28, 2010, U.S. Appl. No. 12/403,175 0.
Amendment filed Jan. 29, 2010 in response to Dec. 28, 2010 Office Action, U.S. Appl. No. 12/403,175 0.
International Search Report and Written Opinion dated Oct. 6, 2009, App. No. PCTIUS2009/36921 0.
International Search Report and Written Opinion dated Apr. 12, 2010, App. No. PCTIUS2009/55421 0.
International Search Report and Written Opinion dated Jan. 26, 2011, App. No. PCT/US2010/39639.
Japanese Office Action for Application No. 2010-550853 dated Sep. 18, 2013.
Taiwanese Office Action for Application No. 098108067 dated Dec. 25, 2013.
Chinese Office Action for Application No. 200980149285.2 dated Feb. 28, 2014.

(56) References Cited

OTHER PUBLICATIONS

Japanese Office Action for Application No. 2011540873 dated Jan. 22, 2014.
International Search Report and Written Opnion for Application PCT/US2007/021552 dated May 29, 2008.
International Search Report for Application No. PCT/US2009/003643 dated Aug. 28, 2009.
International Search Report and Written Opinion for Application No. PCT/US08/09207 dated Jan. 16, 2009.
Japanese Office Action for Application No. 2012-517680 dated Jul. 25, 2014.
International Search Report for PCT Application No. PCT/US2008/067541 dated Oct. 27, 2008 (dated Oct. 27, 2008).
International Preliminary Report on Patentability for Application PCT/US2008/067541 dated Jan. 7, 2010.
Office Action dated Dec. 1, 2009, U.S. Appl. No. 12/142,589, titled "Wafer level surface passivation of stackable Integrated circuit chips".
Amendment filed Mar. 1, 2010, U.S. Appl. No. 12/142,589, in response to Office Action dated Dec. 1, 2009.
Taiwanese Office Action for Application No. 098119939 dated Aug. 29, 2014.
Chinese Office Action for Application No. 201080035256.6 dated Jul. 17, 2014.
Chinese Office Action for Application No. 201180031606.6 dated Dec. 11, 2014
Taiwanese Office Action for Application No. 099136720 dated May 18, 2015.
Japanese Office Action for Application No. 2012-517680 dated Jun. 1, 2015.
Non-Final Office Action for U.S. Appl. No. 12/913,529 dated Dec. 12, 2014.
Advisory Action for U.S. Appl. No. 12/913,529 dated Oct. 21, 2014.
Final Rejection for U.S. Appl. No. 12/913,529 dated Jul. 9, 2014.
Non-Final Office Action for U.S. Appl. No. 12/913,529 dated Dec. 20, 2013.
Chinese Office Action for Application No. 201310240369.5 dated May 28, 2015.
Twainese Office Action for Application No. 10117575 dated Sep. 18, 2015.
International Search Report for Application No. PCT/US2009/067386 dated Jul. 1, 2010.
Written Opinion of the International Searching Authority for Application No. PCT/US2009/067386 dated Jul. 1, 2010.
International Search Report for Application No. PCT/US2010/055472 dated Jul. 27, 2011.
Written Opinion of the International Searching Authority for Application No. No. PCT/US20101055472 dated Jul. 27, 2011.
U.S. Appl. No. 12/124,097, filed May 20, 2008.
International Search Report for Application No. PCT/US2010/039639 dated Jan. 26, 2011.
Written Opinion of the International Searching Authority for Application No. PCT/US2010/039639 dated Jan. 26, 2011.
Ko, et al. Development of three-dimensional memory die stack packages using polymer insulated sidewall technique, 1999.
Office Action dated Jun. 9, 2010, U.S. Appl. No. 12/251,624.
Amendment filed Dec. 9, 2010 in response to Jun. 9, 2010 Office Action, U.S. Appl. No. 12/251,624.
Final Office Action dated Mar. 1, 2011, U.S. Appl. No. 12/251,624.
Office Action (Restriction) dated May 24, 2010, U.S. Appl. No. 12/124,097.
Amendment filed Jun. 26, 2010 in response to May 24, 2010 Office Action, U.S. Appl. No. 12/124,097.
Office Action dated Oct. 14, 2010, U.S. Appl. No. 12/124,097.
Amendment filed Feb. 14, 2011 in response to Oct. 14, 2010 Office Action, U.S. Appl. No. 12/124,097.
Notice of Allowability, dated Oct. 19, 2006 U.S. Appl. No. 11/090,969.
Office Action (Restriction) dated Apr. 20, 2009, U.S. Appl. No. 11/744,142.
Amendment filed May 22, 2009 in response to Apr. 20, 2009 Office Action, U.S. Appl. No. 11/744,142.
Office Action dated Aug. 3, 2009, U.S. Appl. No. 11/744,142.
Amendment filed Dec. 3, 2009 in response to Aug. 3, 2009 Office Action, U.S. Appl. No. 11/744,142.
Final Office Action dated Mar. 18, 2010, U.S. Appl. No. 11/744,142.
Notice of Appeal filed Sep. 16, 2010 in response to Mar. 18, 2010 Office Action, U.S. Appl. No. 11/744,142.
Amendment and RCE filed Mar. 16, 2011 in response to Mar. 18, 2010 Office Action, U.S. Appl. No. 11/744,142.
Office Action dated Feb. 7, 2006, U.S. Appl. No. 11/097,829.
Amendment A filed Aug. 7, 2006 in response to Feb. 7, 2006 Office Action, U.S. Appl. No. 11/097,829.
Final Office Action dated Jan. 8, 2007, U.S. Appl. No. 11/097,829.
Amendment filed Jan. 24, 2007 in response to Jan. 8, 2007 Office Action, U.S. Appl. No. 11/097,829.
Notice of Allowance, dated Feb. 12, 2007, U.S. Appl. No. 11/097,829.
Notice to File Corrected Papers, dated Mar. 30, 2007, U.S. Appl. No. 11/097,829.
Amendment filed May 29, 2007 in response to Mar. 30, 2007 Notice, U.S. Appl. No. 11/097,829.
Office Action (Restriction) dated Dec. 28, 2010, U.S. Appl. No. 12/403,175.
Office Action dated Dec. 31, 2007, U.S. Appl. No. 11/744,153.
Amendment filed Apr. 11, 2008 in response to Dec. 31, 2007 Office Action, U.S. Appl. No. 11/744,153.
Final Office Action dated Jul. 1, 2010, U.S. Appl. No. 11/744,153.
Amendment filed Oct. 1, 2008 in response to Jul. 1, 2010 Office Action, U.S. Appl. No. 11/744,153.
Advisory Action, dated Oct. 20, 2008, U.S. Appl. No. 11/744,153.
Amendment and RCE filed Nov. 26, 2008 in response to Oct. 20, 2008 Advisory Action, U.S. Appl. No. 11/744,153.
Notice of Allowance dated Feb. 27, 2009, U.S. Appl. No. 11/744,153.
Office Action (Restriction) dated Oct. 7, 2009, U.S. Appl. No. 12/143,157.
Amendment filed Nov. 9, 2009 in response to Oct. 7, 2009 Office Action, U.S. Appl. No. 12/143,157.
Office Action dated Dec. 30, 2009, U.S. Appl. No. 12/143,157.
Amendment filed Jun. 30, 2009 in response to Dec. 30, 2009 Office Action, U.S. Appl. No. 12/143,157.
Final Office Action, dated Aug. 5, 2010, U.S. Appl. No. 12/143,157.
Amendment and RCE filed Feb. 7, 2011 in repsonse to Aug. 5, 2010 Office Action, U.S. Appl. No. 12/143,157.
Office Action dated Mar. 1, 2011, U.S. Appl. No. 12/143,157.
Amendment filed Jan. 29, 2010 in response to Dec. 28, 2010 Office Action, U.S. Appl. No. 12/403,175.
Office Action (Restriction) dated Feb. 4, 2010, U.S. Appl. No. 12/251,624.
Amendment filed Mar. 4, 2010 in response to Feb. 4, 2010 Office Action, U.S. Appl. No. 12/251,624.
International Search Report and Written Opinion for Application No. PCT/US2009/047389 dated Jan. 14, 2010.
International Search Report and Written Opinion for Application No. PCT/US2010/054325 dated Jul. 28, 2011.
Taiwanese Office Action and Search Report for Application No. 099137634 dated Dec. 22, 2015.
International Search Report and Written Opinion dated Mar. 23, 2009, International Application No. PCT/US2008/074450.
Office Action dated Dec. 22, 2006, U.S. Appl. No. 11/016,558.
Amendment filed Jun. 21, 2007 in response to Dec. 22, 2006 Office Action, U.S. Appl. No. 11/016,558.
Final Office Action dated Jul. 19, 2007, U.S. Appl. No. 11/016,558.
Amendment filed Sep. 19, 2007 in response to Jul. 19, 2007 Office Action, U.S. Appl. No. 11/016,558.
Advisory Action dated Oct. 10, 2007, U.S. Appl. No. 11/016,558.
Response filed Oct. 19, 2007 to Oct. 10, 2007 Advisory Action, U.S. Appl. No. 11/016,558.
Amendment filed Jan. 22, 2007 in response to Jul. 19, 2007 Office Action, U.S. Appl. No. 11/016,558.
Office Action dated Mar. 27, 2008, U.S. Appl. No. 11/016,558.

(56) References Cited

OTHER PUBLICATIONS

Amendment filed Jun. 27, 2008 in response to Mar. 27, 2008 Office Action, U.S. Appl. No. 11/016,558.
Final Office Action dated Sep. 15, 2008, U.S. Appl. No. 11/016,558.
Amendment filed Oct. 14, 2008 in response to Sep. 15, 2008 Office Action, U.S. Appl. No. 11/016,558.
Office Action dated Dec. 15, 2008, U.S. Appl. No. 11/016,558.
Amendment filed Apr. 8, 2009 in response to Dec. 15, 2008 Office Action, U.S. Appl. No. 11/016,558.
Office Action dated Jul. 15, 2009, U.S. Appl. No. 11/016,558.
Response filed Aug. 5, 2009 in response to Jul. 15, 2009 Office Action, U.S. Appl. No. 11/016,558.
Notice of Allowance dated Dec. 17, 2009, U.S. Appl. No. 11/016,558.
EP Supplemental Search Report dated Nov. 5, 2007, EP Application No. 05736129.7.
Office Action dated Mar. 19, 2008, EP Application No. 057361291.
Office Action dated Jan. 27, 2009, U.S. Appl. No. 11/849,162.
Amendment filed Mar. 27, 2009 in response to Jan. 27, 2009 Office Action, U.S. Appl. No. 11/849,162.
Office Action (Restriction) dated Jun. 24, 2009, U.S. Appl. No. 11/849,162.
Amendment filed Jul. 8, 2009 in response to Jun. 24, 2009 Office Action, U.S. Appl. No. 11/849,162.
Supplemental Amendement filed Aug. 5, 2009, U.S. Appl. No. 11/849,162.
Office Action (Restriction) dated Oct. 7, 2009, U.S. Appl. No. 11/849,162.
Amendment filed Nov. 9, 2009 in response to Oct. 7, 2009 Office Action, U.S. Appl. No. 11/849,162.
Office Action dated Jul. 21, 2010, U.S. Appl. No. 11/849,162.
Amendment filed Jan. 21, 2011 in response to Jul. 21, 2010 Office Action, U.S. Appl. No. 11/849,162.
Ex Parte Quayle Action mailed 217/06, U.S. Appl. No. 11/090,969.
Amendment A filed Aug. 7, 2006 in response to Feb. 7, 2006 Quayle Action, U.S. Appl. No. 11/090,969.
Notice of Allowability, dated Oct. 19, 2006, U.S. Appl. No. 11/090,969.
EP Supplementary Search Report dated Jun. 5, 2008, EP App. No. 05735136.3.
Amendment filed Apr. 1, 2008 in response to Dec. 31, 2007 Office Action, U.S. Appl. No. 11/744,153.
Office Action (Restriction) dated Jan. 21, 2010, U.S. Appl. No. 12/046,651.
Amendment filed Feb. 22, 2010 in response to Feb. 21, 2010 Office Action, U.S. Appl. No. 12/046,651.
Office Action dated Aug. 18, 2010, U.S. Appl. No. 12/046,651.
Amendment filed Jan. 18, 2011 in response to Aug. 18, 2010 Office Action, U.S. Appl. No. 12/046,651.

* cited by examiner

U.S. 9,824,999 B2

SEMICONDUCTOR DIE MOUNT BY CONFORMAL DIE COATING

CROSS-REFERENCE TO RELATED APPLICATIONS

The present application is a divisional of U.S. patent application Ser. No. 14/242,206, filed on Apr. 1, 2014, which application is a divisional of U.S. patent application Ser. No. 12/199,080, filed on Aug. 27, 2008, now U.S. Pat. No. 8,704,379, which claims the benefit of the filing date of U.S. Provisional Application No. 60/971,203,titled "Semiconductor die mount by conformal die coating", which was filed on Sep. 10, 2007,all of which are hereby incorporated herein by reference.

BACKGROUND

This invention relates to mounting semiconductor die on a support.

A semiconductor integrated circuit die may be mounted directly onto a printed circuit board; or on a leadframe or a substrate; or on another semiconductor die in a stacked die assembly.

A semiconductor integrated circuit die is conventionally mounted on the support using an adhesive. Die mount adhesives may take the form of a die attach epoxy, as illustrated for example in FIGS. 1 and 2; or an adhesive film, as illustrated for example in FIGS. 3 and 4.

FIG. 1 shows an assembly including a die 22 mounted on a substrate 10 using a die attach epoxy. The die 22 has a front side ("active" side) 23 adjacent which the integrated circuitry is formed, and a back side 21, and sidewalls meeting the front and back sides at front and back edges. Die pads at the front side of the die, arranged in this example as peripheral pads 24, provide for electrical connection of the integrated circuitry of the die with underlying circuitry.

The substrate 10 in this example includes a patterned metal layer 12 on a dielectric layer. The patterned metal layer 12 is covered by an electrically insulative layer 13, which has openings exposing bond fingers 11. The substrate may include one or more additional patterned metal layers, variously connected at vias through intervening dielectric layers, including a patterned metal layer at the surface opposite the die mount surface, at which lands are exposed to provide for connection to circuitry in a device in which the assembly is deployed.

The die 22 is in this example affixed to a die mount region of the substrate by a die attach epoxy 32. The die mount procedure includes dispensing a specified quantity of epoxy onto the insulative layer 13, placing the die onto the epoxy, and curing the epoxy. Typically a "fillet" 33 is formed outside the die footprint at the periphery of the die mount region. The epoxy die attach process is carefully controlled to provide for a uniform die attach epoxy thickness and a limited spread of epoxy onto the substrate outside the die footprint. Following die attach, the die is electrically connected to the circuitry on the substrate by wire bonds 14 connecting pads 24 with bond fingers 11. A molding or encapsulation (not shown in the FIG.) may be formed over the assembly to protect the active side of the die and the interconnects.

FIG. 2 shows an assembly including a first die 22 mounted on a substrate 10 generally as described with reference to FIG. 1, and including an additional die 26 mounted on the first die 22 using a die attach epoxy. The additional die 26 has a front side ("active" side) 27 adjacent which the integrated circuitry is formed, and a back side 25, and sidewalls meeting the front and back sides at front and back edges. Die pads at the front side of the die, arranged in this example as peripheral pads 28, provide for electrical connection of the integrated circuitry of the die with underlying circuitry.

The second die 26 is in this example affixed to a die mount region on the front side 23 of the first die 22 by a die attach epoxy 34. The second die mount procedure, as with the first die mount procedure, includes dispensing a specified quantity of epoxy onto a die attach region of the front side of die 22, placing the second die onto the epoxy, and curing the epoxy. Typically a "fillet" 35 is formed outside the die footprint at the periphery of the die mount region. As in the first die attach process, this second epoxy die attach process is carefully controlled to provide for a uniform die attach epoxy thickness and a limited spread of epoxy onto the first die surface 23 outside the die footprint. Following die attach, the die is electrically connected to the circuitry on the substrate by wire bonds 16 connecting pads 28 with bond fingers 11. A molding or encapsulation (not shown in the FIG.) may be formed over the assembly to protect the active side of the die and the interconnects.

FIG. 3 shows an assembly including a die 22 mounted on a substrate 10 using a film adhesive 42. The die and the substrate, and their electrical connections to the substrate, are as in the example shown in FIG. 1.

The die 22 is in this example affixed to a die mount region of the substrate by a film adhesive 42. The die mount procedure includes applying the film to either the backside of the die 22 or to the die mount region of the substrate 10, thereafter placing the die onto the insulative layer 13 on the substrate, and thereafter (where the adhesive is curable) curing the adhesive. Where the adhesive film is applied to the substrate, the film must first be cut to size, and then positioned on the substrate surface; where the film is applied to the die, this step may be performed at the wafer level, so that the film is cut to size during die singulation. Following die attach, the die is electrically connected to the circuitry on the substrate by wire bonds 14 connecting pads 24 with bond fingers 11. A molding or encapsulation (not shown in the FIG.) may be formed over the assembly to protect the active side of the die and the interconnects.

FIG. 4 shows an assembly including a first die 22 mounted on a substrate 10 generally as described with reference to FIG. 3, and including an additional die 26 mounted on the first die 22. The die and the substrate, and their electrical connections to the substrate, are as in the example shown in FIG. 3. The second die mount procedure, as with the first die mount procedure, includes applying the film to either the backside of the die 26 or to the die mount region of the front side of the first die 22, thereafter placing the second die onto the first die, and thereafter (where the adhesive is curable) curing the adhesive. Where the adhesive film is applied to the substrate, the film must first be cut to size, and then positioned on the surface of the first die; where the film is applied to the second die, this step may be performed at the wafer level, so that the film is cut to size during second die singulation. Following die attach, the second die is electrically connected to the circuitry on the substrate by wire bonds 16 connecting pads 28 with bond fingers 11. A molding or encapsulation (not shown in the FIG.) may be formed over the assembly to protect the active side of the die and the interconnects.

SUMMARY

In a general aspect of the disclosure, a conformal coating on a semiconductor die provides adhesion between the die and a support. No additional adhesive is necessary to affix the die on the support. The conformal coating protects the die during assembly, and serves to electrically insulate the die from electrically conductive parts that the die may contact.

In various embodiments the support may include a printed circuit board, or a substrate, or a leadframe, or another die, or an interposer, for example.

In some embodiments the material of the conformal coating includes an organic polymer, for example a polymer of p-xylene or a derivative thereof, such as a polyxylylene polymer, e.g., a parylene C or a parylene N, or a parylene A, or a parylene SR. In some embodiments the conformal coating is formed by deposition, for example by vapor deposition, or liquid phase deposition, or by solid phase deposition.

The conformal coating is formed on at least a die mount area of at least one side of the die, and the die is mounted on a die mount region of a support surface; adhesion of the die to the support is provided by the conformal coating on the die.

In some embodiments the conformal coating covers the back side of the die, and may additionally cover one or more sidewalls, and may additionally cover the front side of the die; where the conformal coating covers the front side of the die, openings are provided in the coating to expose die pads for electrical connection of the die.

In some embodiments the support also has a conformal coating, on at least the die mount region. The material of the conformal coating on the support may be the same as, or different from, the conformal coating on the die; in some embodiments the material of the conformal coating includes an organic polymer, for example a polymer of p-xylene or a derivative thereof, such as a polyxylylene polymer, e.g., a parylene C or a parylene N, or a parylene A, or a parylene SR. In some embodiments the conformal coating is formed by deposition, for example by vapor deposition, or liquid phase deposition, or by solid phase deposition.

Where the support is another die, the conformal coating may cover the front side of the die, and may additionally cover one or more sidewalls, and may additionally cover the back side of the die; where the conformal coating covers the front side of the die, openings are provided in the coating to expose die pads for electrical connection of the die.

In another general aspect of the disclosure, a method for affixing a die onto a support includes providing a die having a conformal coating, contacting a die attach area of the conformal coating with a die mount region of the support, and heating the die attach area of the conformal coating. In some embodiments the heating procedure follows the contacting procedure; in some embodiments the contacting procedure follows the heating procedure. That is, the coated die may be heated prior to contacting the die and the support to make an assembly; or, the die and the support may be contacted to form an assembly, and the assembly may then be heated to effect adhesion.

In another general aspect of the disclosure, a method for affixing a die onto a support includes providing a die having a conformal coating, providing a support having a conformal coating, contacting a die attach area of the conformal coating on the die with a die mount region of the conformal coating on the support, and heating the die attach area of the conformal coating on the die or the die mount region of the conformal coating on the support.

In some embodiments the heating procedure follows the contacting procedure; in some embodiments the contacting procedure precedes the heating procedure. That is, the coated die may be heated prior to contacting the die and the support to make an assembly; or, the die and the support may be contacted to form an assembly, and the assembly may then be heated. In some embodiments the heating procedure follows the contacting procedure; in some embodiments the contacting procedure precedes the heating procedure.

In another general aspect of the disclosure, a method for affixing a die onto a support includes placing the die onto the support, providing a standoff between a die attach surface of the die and a die mount surface of the support, and carrying out a conformal coating process to coat at least the die attach surface and the die mount surface. The conformal coating material may be an organic polymer, such as a parylene, for example, and the conformal coating process may be a vapor deposition process; the polymer that forms in the space between the die surface and the support surface provides adhesion between the die and the support.

The assemblies according to the disclosure can be used for building computers, telecommunications equipment, and consumer and industrial electronics devices.

DETAILED DESCRIPTION

The invention will now be described in further detail by reference to the drawings, which illustrate alternative embodiments. The drawings are diagrammatic, showing features of the invention and their relation to other features and structures, and are not made to scale. For improved clarity of presentation, in the FIGS. illustrating various embodiments, elements corresponding to elements shown in other drawings are not all particularly renumbered, although they are all readily identifiable in all the FIGs. Also for clarity of presentation certain features are not shown in the FIGs., where not necessary for an understanding of the disclosure.

U.S. Pat. No. 7,215,018 describes a stacked die assembly including die each having a conformal coating on all six sides. The conformal coating is said to provide electrical insulation and to reduce physical damage to the die during handling and processing. A polymer, for example parylene, is suggested as the die coating insulating material. The coated die in the stack are laminated on top of each other with an electrically insulating polymer or epoxy preformed sheet, which may include solid (for example, glass) spheres to maintain a fixed spacing and separation between the semiconductor die after lamination.

Figure 1:
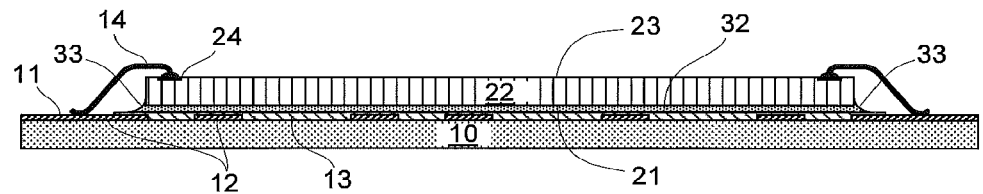
FIG. 1 is a diagrammatic sketch in a sectional view showing a die mounted onto a substrate using a conventional die mount epoxy.
Figure 2:
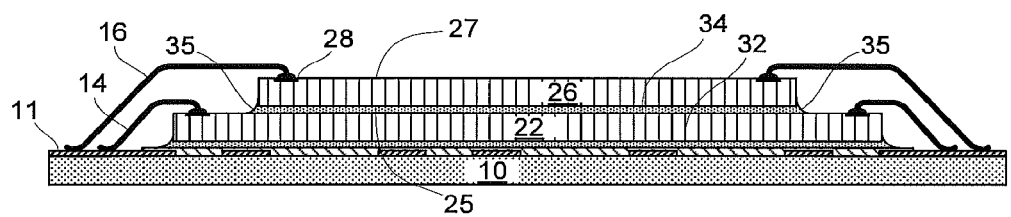
FIG. 2 is a diagrammatic sketch in a sectional view showing a stack of two die mounted onto one another and mounted onto a substrate using a conventional die mount epoxy.
Figure 3:
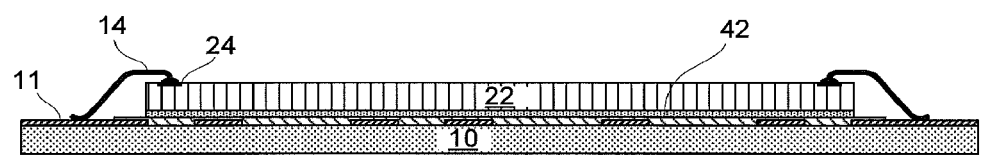
FIG. 3 is a diagrammatic sketch in a sectional view showing a die mounted onto a substrate using a conventional film adhesive.
Figure 4:
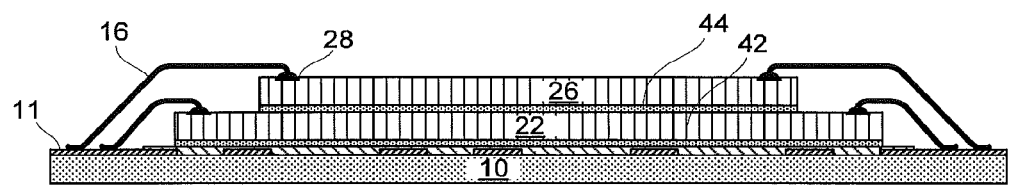
FIG. 4 is a diagrammatic sketch in a sectional view showing a stack of two die mounted onto one another and mounted onto a substrate using a conventional film adhesive.
Figure 5:
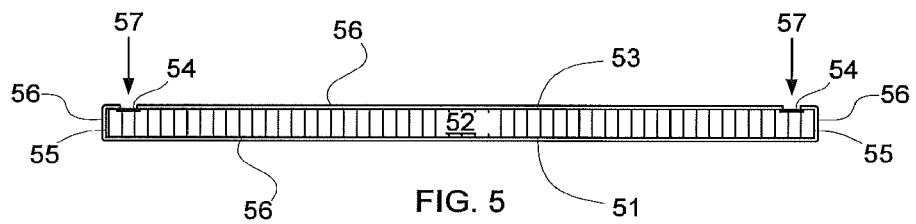
FIG. 5 is a diagrammatic sketch in a sectional view showing a die having a conformal coating over the front side, the back side, and sidewalls, the coating having openings exposing interconnect pads at the front side.

Turning now to FIG. 5, there is shown in a diagrammatic sectional view a die 52 having a conformal coating 56 over the front side 53, the back side 51, and sidewalls 55. Openings indicated by arrows 57 expose peripheral die pads 54 for electrical connection of the die. The material of the conformal coating may be an organic polymer, for example a polymer of p-xylene or a derivative thereof, such as a polyxylylene polymer, e.g., a parylene C or a parylene N, or a parylene A, or a parylene SR.

A die may be coated with a parylene as shown in FIG. 5 by a vapor phase polymerization process. Processes for forming parylene are known. In one process, a para-xylylene dimer is vaporized at a pressure below atmosphere and at a temperature sufficient to vaporize the dimer at that pressure; then the vaporized dimer is pyrolized by heating to form the reactive para-xylylene monomer; then the reactive monomer and the item to be coated are brought together in a chamber with ambient temperature and reduced pressure, whereupon the reactive monomer condenses on all exposed surfaces within the chamber, including all exposed surface of the item, and polymerizes in situ. As is well known various process parameters can be controlled to determine the thickness of the resulting coating. Where the parylene coating on the die surface provides electrical insulation between adjacent parts, the thickness should be at least sufficient to provide insulation; and where the parylene coating on a die surface provides a barrier, for example to moisture, the thickness should be at least sufficient to provide such a barrier. In some examples the parylene coating on a die surface to be mated to another die surface has a thickness in a range about 0.1 micron to about 100 microns, more usually in a range in the order of one to a few microns to a few tens of microns.

Various of these procedures may be carried out sequentially or at least partly concurrently, and they may be carried out in a staged processing apparatus. The die may be positioned in the chamber such that one or more of the six sides of the die are entirely or partially obscured. The coating may be carried out, for example, at the wafer level, and as a result only the exposed surface of the wafer will be coated; subsequent die singulation results in die coated only on the corresponding surface of the die. Or, the coating may be carried out at a die array level, in which the wafer is partly or fully sawn; the resulting coating will cover part or the entirety of the sidewalls and either the die back sides (if the back side of the wafer is exposed) or the front sides (if the front side of the wafer is exposed) of the resulting die will be covered. Or, coating of all sides of the die may be obtained by carrying out two coating procedures, and turning the die (or wafer) over between the two procedures. Examples of various procedures for coating die at the wafer level and the die array level are described in, for example, S. J. S. McElrea et al. U.S. application Ser. No. 12/142,589, titled "Wafer level surface passivation of stackable integrated circuit chips", which was filed on Jun. 19, 2008, and which is incorporated by reference herein.

Where as a result of the vapor phase polymerization process the front side of the die is covered, openings in the coating may be formed, for example, by laser ablation.

Figure 6:
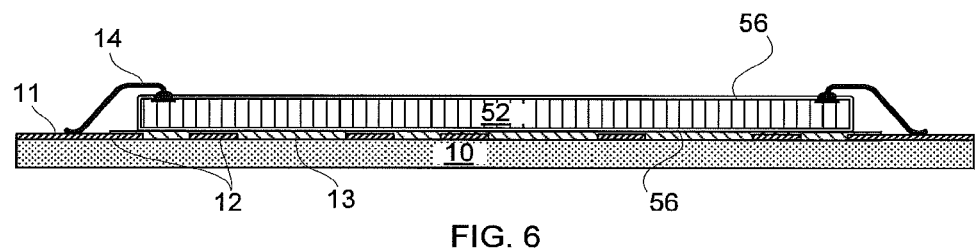
FIG. 6 is a diagrammatic sketch in a sectional view showing a die mounted onto a substrate according to an embodiment.

FIG. 6 shows an assembly including a conformally coated die mounted onto a substrate according to an embodiment of the invention. The substrate 10 is configured in this example substantially as in FIGS. 1-4, and the die 52 is configured substantially as in FIG. 5. The coated die in this example rests directly on the substrate (that is, directly on the dielectric layer 13 overlying the patterned metal layer 12), and adhesion of the coated die to the die attach region of the substrate is provided by the coating 56 at the die attach area on the back side of the die.

Adhesion of the coated die to the substrate is accomplished by heating the coating at the die attach area on the back side of the die to a temperature sufficient to affect adhesion of the die attach area with the substrate. This may be accomplished by, for example, heating the coated die to a temperature at which the material of the coating has some degree of surface tack, and then placing the die onto the die attach region of the substrate with the tacky surface contacting the substrate surface (that is, contacting the dielectric layer 13 overlying the patterned metal layer 12). Or, the coated die may be placed upon the substrate to make a die-on-substrate assembly, and then the assembly may be heated to heat the coating. As may be appreciated, the placing and the heating may be carried out sequentially or to some extent concurrently. The coating may be heated by convection or by conduction, for example, employing radiation (such as microwave radiation) or employing a heated platform, for example; and in some embodiments the substrate may be heated so that the coating is heated upon contact with the heated substrate. For example, where a parylene is used, adhesion may be accomplished by heating to a temperature in a range about 120° C. to about 230° C., usually not greater than about 175° C. to about 200° C. and more usually in a range about 125° C. to about 150° C. (excessive heating may damage the parylene coating). Adhesion may optionally be facilitated by application of pressure between the die and the substrate in addition to heat, and in some examples, where a parylene is used, applying a pressure about 5 N per square cm, or weighting the die on the substrate with a mass equivalent to about 10 kg per square cm, may be useful. Uniform adhesion may be facilitated by heating (and optionally applying pressure) for a time in a range about 1 second to about 30 minutes, for example about 10 minutes.

Following die attach, the die 52 is electrically connected to circuitry in the substrate 10, in this example by wire bonds connecting exposed die pads 54 to bond fingers 11. Openings are made in the coating at selected sites, for example by laser ablation, to expose the die pads prior to wire bond formation; opening may be carried out at any stage after the front side is coated and before the wire bond is attached, as may be convenient for the particular process.

Figure 7:
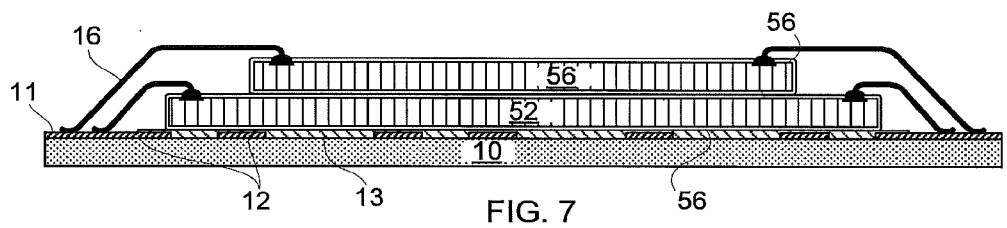
FIG. 7 is a diagrammatic sketch in a sectional view showing die mounted one upon the other in a die stack mounted onto a substrate according to an embodiment.

FIG. 7 shows an assembly including a first coated die 52 mounted on a substrate 10 generally as described with reference to FIG. 6, and including an additional coated die 56 mounted on the first die 52. The additional die 56 has a front side ("active" side) adjacent which the integrated circuitry is formed, and a back side, and sidewalls meeting the front and back sides at front and back edges. Die pads at the front side of the die, arranged in this example as peripheral pads, provide for electrical connection of the integrated circuitry of the additional die with underlying circuitry. The additional die is affixed to a die mount region on the front side of the first die 52 by adhesion between the coatings on the opposed surfaces of the respective die, that is, on the front side of the first die and on the back side of the additional die.

The second die mount procedure, as with the first die mount procedure, may be carried out substantially as for the first die mount. That is, the coated second die may be heated and then placed upon the first die (and, optionally, pressure may be applied between the second die and the first die), or the second die may be placed on the first die and then the assembly may be heated (and, optionally, pressure may be applied). Or, alternatively, all the die may be placed one over another on the substrate to form a stacked die-on-substrate assembly, and then the assembly may be heated (and, optionally, pressure may be applied) to effect adhesion. Following die attach, the additional die is electrically connected to the circuitry on the substrate by wire bonds 16 connecting die pads on the additional die with bond fingers 11. Openings are made in the coating at selected sites, to expose die pads prior to wire bond formation. A molding or encapsulation (not shown in this FIG.) may be formed over the assembly to protect the active side of the die and the interconnects.

A die stack, not affixed to a non-die support, may optionally be made by providing a first coated die and a second coated die, and heating a contact area of the coating on at least one of the die, and then placing one die onto the die attach region of the other die with a contact area of the surface of one coating contacting the die attach region of the surface of the other coating (and, optionally, applying pressure). This can be completed for any number of additional die, to form a multiple die stack of adhered die. Or, the die may be positioned one upon another to form a stack, and then the stack can be heated (and, optionally, pressure applied) to effect adhesion of all the die at once to form a multiple die stack of adhered die. Optionally one or more stacks of die may be held in a fixture, adapted to maintain the relative positions of the die in the stack, and optionally adapted to provide a compressive force on the stack. Examples of suitable fixtures are described, for example, in McGrath et al. International Application No. PCT/US08/6651, titled "Method for optimized integrated circuit chip interconnection", and in McGrath et al. International Application No. PCT/US08/66568, tiled "Semiconductor die coating and interconnection fixture and method", each of which was filed Jun. 11, 2008. The completed stack of adhered die can then be mounted on a non-die support either by adhesion of the coating on the die that contacts the non-die support (such as, for example, a printed circuit board, or a package substrate, or a leadframe), or by a conventional adhesive.

The examples shown in FIGS. 6 and 7 employ electrical connection by wire bonds. Other interconnects may be employed, and may be preferred. For example, a trace of electrically conductive polymer, for example electrically conductive epoxy or electrically conductive ink, may be laid down to connect a die pad with a bond site in electrical circuitry on a support. Where the conformal coating covers at least those areas of the die that are directly overlain by the epoxy trace, electrical shorting of the epoxy interconnect is avoided. Referring to FIG. 7, for example, a conductive epoxy trace may begin with electrical contact at an exposed die pad on the second die 56, may be drawn across the coated (thereby electrically insulated) margin and front edge of the second die 56, down over the sidewall to the coated (and thereby electrically insulated) front side of the first die 52, may optionally make electrical contact with an exposed die pad on the first die 52, may be drawn across the coated (thereby electrically insulated) margin and front edge of the first die 52, down over the sidewall to the surface of the substrate 10, which is insulated by the dielectric layer 13, and may end with electrical contact with an exposed bond finger 11.

Figure 8:
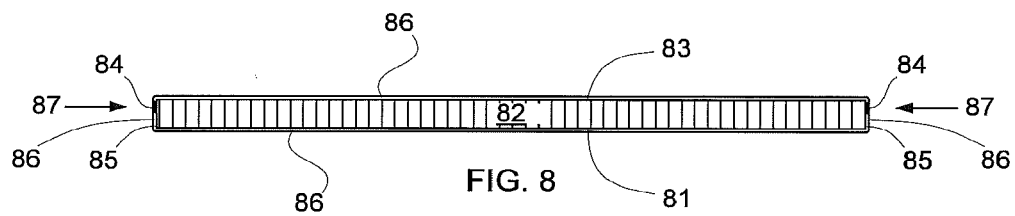
FIG. 8 is a diagrammatic sketch in a sectional view showing a die having a conformal coating over the front side, the back side, and sidewalls, the coating having openings exposing interconnect pads at the sidewalls.
Figure 9:
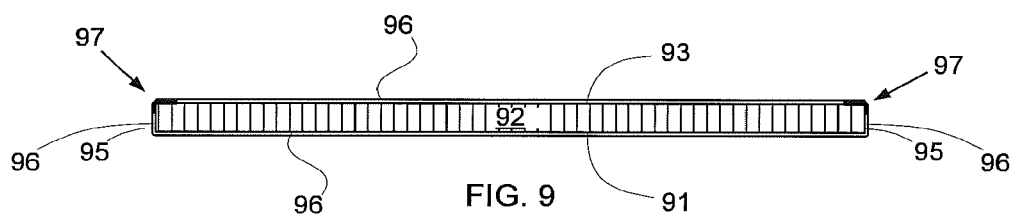
FIG. 9 is a diagrammatic sketch in a sectional view showing a die having a conformal coating over the front side, the back side, and sidewalls, the coating having openings exposing interconnect pads at the sidewalls and at the front side adjacent front side edges.

FIGS. 8 and 9 show, in diagrammatic sectional view, embodiments of conformally coated die having interconnect terminals exposed at the sidewalls of the die. In FIG. 8, a die 82 has a front side 83 and a back side 81 and sidewalls 85, all coated with a conformal coating 86, except that interconnect terminals 84 are situated at the sidewalls and exposed as indicted by arrows 87. In FIG. 9, a die 92 has a front side 93 and a back side 91 and sidewalls 95, all coated with a conformal coating 96, except that interconnect terminals 94 wrap around a front edge of the die (which may optionally be chamfered) and are exposed at the sidewall and at the margin of the front side, and at the die edge as indicated by arrows 97.

Figure 10A:
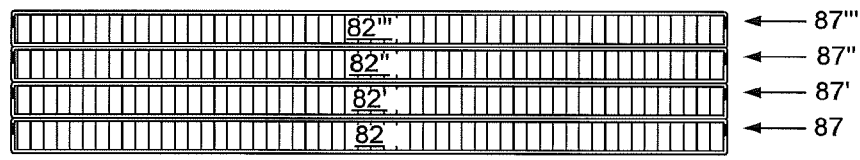
FIGS. 10A, 11A are diagrammatic sketches in sectional view each showing a stack of four die mounted one onto another according to an embodiment.
Figure 11A:
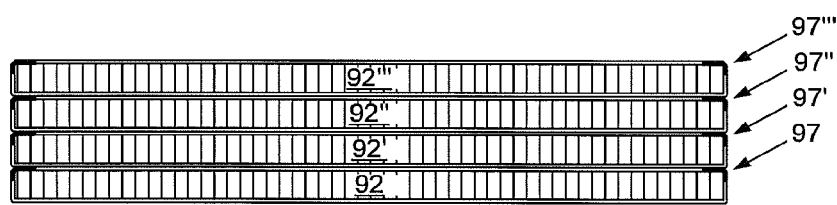
Figure 10B:
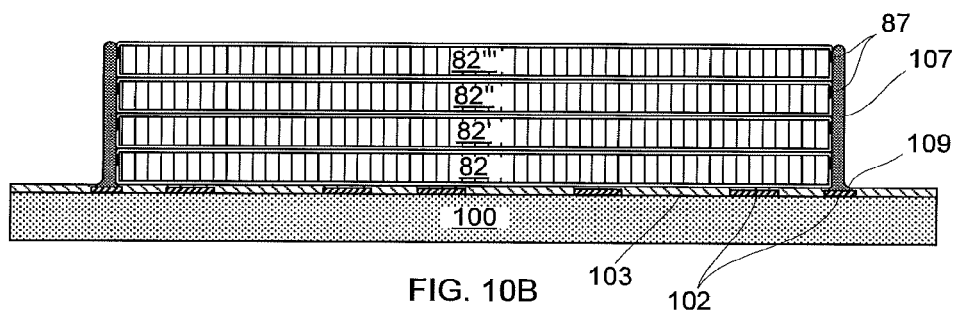
FIGS. 10B, 11B are diagrammatic sketches in sectional view each showing a four die stack as in FIGS. 10A, 11A mounted onto and electrically interconnected with a substrate according to an embodiment.
Figure 11B:
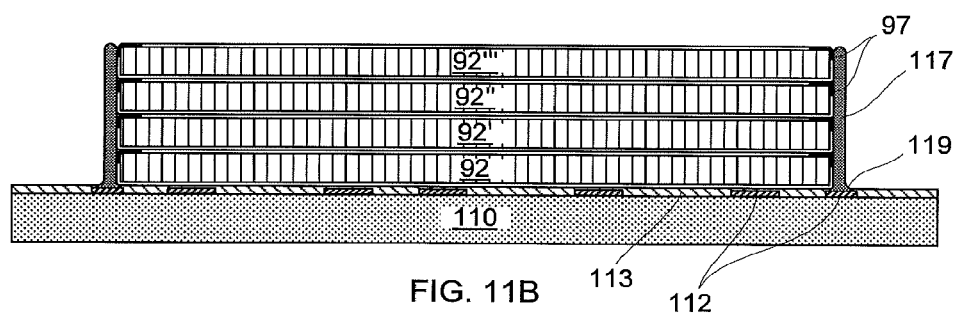

Coated die as in FIGS. 8 and 9 may optionally be stacked with sidewalls aligned, as shown in FIGS. 10A and 11A, respectively, and affixed by adhesion of the coatings as described above. Referring to these FIGs., the interconnect terminals 87, 87', 87'', 87''' (in FIG. 10A) and the interconnect terminals 97, 97', 97'', 97''' (in FIG. 11A), are now aligned, "vertically" with respect to an arbitrarily assigned "horizontal" plane of the front or back sides of the die and, accordingly, they may be vertically interconnected, for example using a trace of electrically conductive epoxy. FIGS. 10B and 11B respectively show stacked die as in FIGS. 10A and 11A with the die in each stack electrically interconnected and each stack connected to a substrate. Referring to FIG. 10B, a substrate 100 is shown having a patterned metal layer 102 on a dielectric layer, and covered by an insulative layer 103 except where, as indicated at 109, vertical interconnection is to be made. Here a stack of die as in FIG. 10A is mounted onto the substrate 100, affixed by adhesion of the conformal coating on the backside of the die 82 to a die mount region of the substrate surface. Vertical interconnection is made by conductive epoxy traces 107, which make electrical contact with interconnect terminals 87 at the sidewalls of the die and with the exposed interconnect sites 109.

Referring to FIG. 11B, a substrate 110 is shown having a patterned metal layer 112 on a dielectric layer, and covered by an insulative layer 113 except where, as indicated at 119, vertical interconnection is to be made. Here a stack of die as in FIG. 11A is mounted onto the substrate 110, affixed by adhesion of the conformal coating on the backside of the die 92 to a die mount region of the substrate surface. Vertical interconnection is made by conductive epoxy traces 117, which make electrical contact with interconnect terminals 97 at the sidewalls of the die and with the exposed interconnect sites 119.

In some embodiments, as described above, individual die are provided prior to stacking and adhesion with a conformal coating over at least a contact area; and the coated die are stacked and treated to effect adhesion. In the illustrated examples, the die are coated on the front side, the back side, and the sidewalls; but it is not necessary that all the surfaces of the die be coated. Particularly, the conformal coating may be applied to only one of the mutually opposed die attach surfaces, to effect adhesion of the die with a non-die support or with another die. Further surfaces (or areas of surfaces) of the die may be coated, for example to provide electrical insulation, so that shorting is avoided between the die surface and overarching or overlying electrical interconnects (bond wires or conductive epoxy traces, for example).

In other embodiments, uncoated die may be stacked and then a coating process may be applied to the stack. Where a parylene is formed using a dry vapor deposition, the active monomer condenses on surfaces within very small (narrow) spaces and, accordingly, the polymer can form in a very thin space between adjacent die. Such a very thin layer of polymer can suffice to effect adhesion between adjacent die. Stages in an example of such a process are shown by way of example in FIGS. 12A, 12B, 12C.

It may be preferable, when stacking uncoated die and thereafter applying the coating, to provide for uniform space between the adjacent die. This may be accomplished by providing a small piece of electrically nonconductive film or providing small electrically nonconductive spacers over the surface of each support (die or substrate, for example) and then placing the next die in the stack upon the film or the spacers. Where a small piece of film is employed, the film thickness is selected to provide the desired gap between the surfaces; the film can be roughly shaped and dimensioned, and need not cover any more of the surface than necessary to provide support and the desired spacing. Where small spacers are employed, the height of the spacers as provided on the surface is selected to provide the desired gap; the number of small spacers and their arrangement on the surface can be selected to provide support and the desired spacing. In some embodiments the film or support is substantially incompressible under the processing conditions, or compressible to a determinable extent. The film or spacers may optionally be adhesive, and may optionally be a curable adhesive, so that the film or spacers can provide temporary adhesion between the surfaces, to maintain the relative positions of the parts. This temporary adhesion (where employed) is typically insufficient to securely affix the die to the support, and permanent adhesion is provided by a parylene filling the gap, as described below. The nonconducting film may be an epoxy preform, for example; and the spacers may be small spots or puddles of an epoxy, for example, dispensed or printed in a suitable pattern. Or, the small supports may be (or include) spacer elements of an electrically nonconductive material (such as a glass or an organic polymer) that are dimensioned to provide the desired spacing, and, optionally, they may be provided with a thin surface adhesive to provide temporary adhesion. The spacer elements may have any of a variety of shapes; if spherical, for example, their diameter can provide the appropriate spacing and if spheroidal, for example, their smaller diameter can provide the appropriate spacing.

In some instances, the die as provided by the manufacturer has a protective passivation layer covering at least the active surface. This protective layer may be an organic polymer such as a polyimide, for example, and typically may have a thickness in a range about 5 um to about 6 um. Where a gap between surfaces in a range about the same as the passivation layer is desired, a significant portion of the passivation layer may be selectively removed (for example, in a patterned selective etch process) leaving small spots or areas of the passivation layer (for example, at the corners of the die; or at the corners and abut the center of the die) to serve as spacers.

Figure 12A:
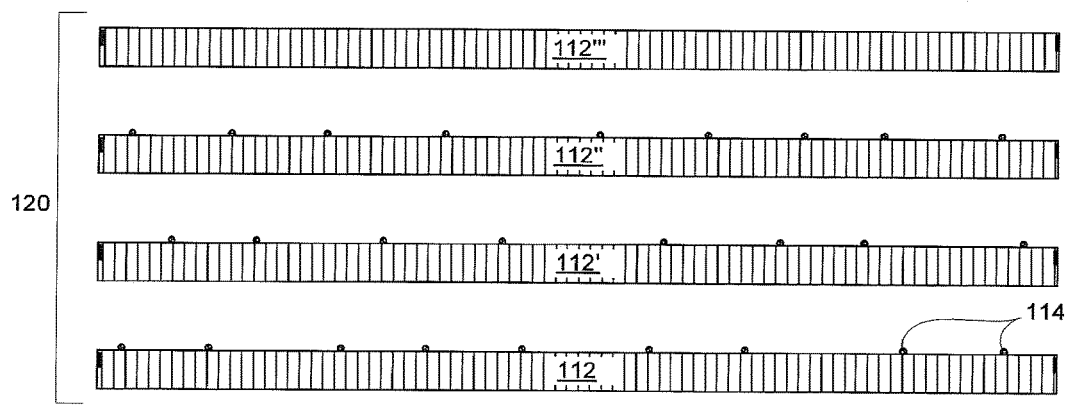
FIGS. 12A-12C are diagrammatic sketches in sectional view showing stages in construction of a conformally coated four die stack assembly according to an embodiment.
Figure 12B:
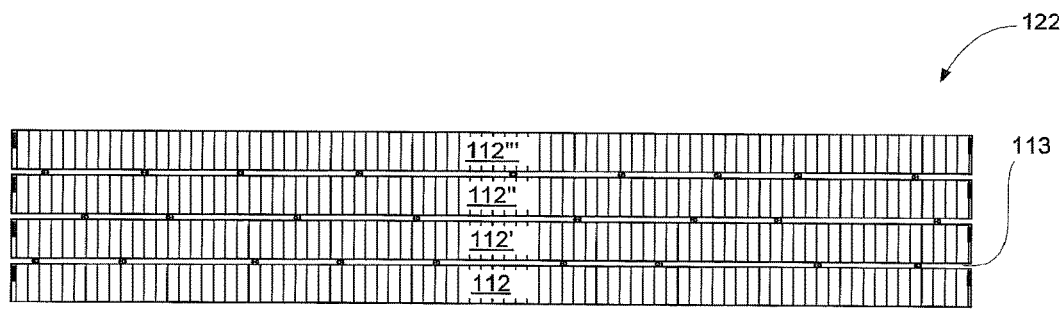

FIG. 12A shows four die 112, 112', 112", 112''', selected 120 for assembly into a four-die stack. Each die except the topmost one in the stack is provided with (in this example) a number of generally spheroidal spacer elements 114 all having approximately the same nominal height. The material of the spacer elements is electrically nonconductive. When the die are placed one over another to form a stack 122, as illustrated in FIG. 12B, the spacer elements provide a standoff, or gap or space 113, between adjacent die, and the height of the spacer elements determines the thickness of the standoff. The spacer elements may have a nominal height in a range about 5 um to about 40 um, for example; in some embodiments the gap between adjacent die may be about 10 um, or about 20 um. As will be appreciated, for a given number of die in the stack thinner gaps between adjacent die results, desirably in some applications, in a thinner overall stack and in some embodiments the gap may be made less than 5 um.

Figure 12C:
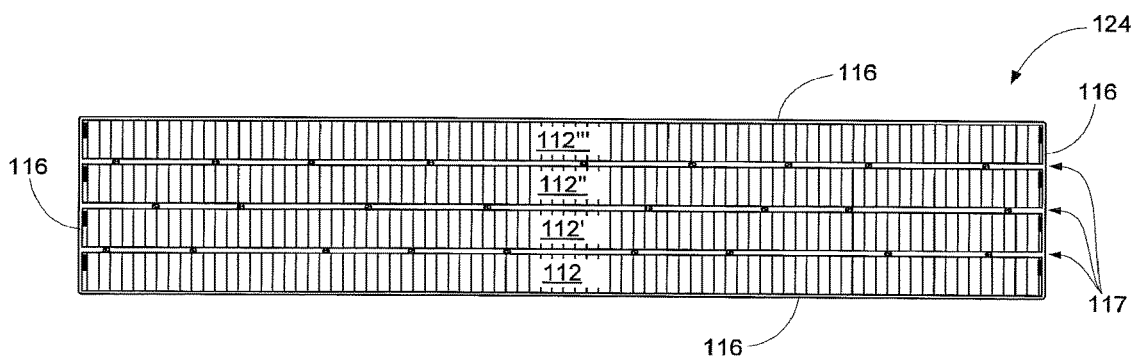

The assembly of spaced-apart die is then subjected to a conformal coating process, resulting in a coated stacked die assembly 124, as shown in FIG. 12C. The coating 116 forms on all exposed surfaces of the assembly, including a die active side at the "top" of the stack, a die backside at the "bottom" of the stack, and die sidewalls; and including the spaced-apart front sides and back sides of adjacent die in the stack, as indicated at 117.

As noted above, the parylene coating is formed by a dry vapor deposition. The active monomer condenses on surfaces within very small (narrow) spaces and, accordingly, the polymer can form in a very thin space between adjacent die. The thinness of a gap between surfaces that can be successfully filled by a parylene depends upon the distance from the edge to the center of the surfaces in the gap, and upon the mean free path of the parylene under the processing conditions employed. The capacity of the parylene monomer to invade the gap can limit the extent of thinness of the gap. The various parylenes have different characteristics, including mean free path characteristics, and for gap filling the choice of parylene and selection of processing conditions can be readily determined accordingly. The gap surfaces to be coated can, for example, be differentially cooled, to promote coating formation from within the gap toward the outside to fill the gap.

In other embodiments the individual die are provided prior to stacking and adhesion with a conformal coating over at least a contact area; the coated die are stacked to form an assembly of coated die; and the assembly of coated die is subjected to a further conformal coating process to encapsulate the stack and, optionally, to effect adhesion of the die in the stack and/or the stack to an additional stack or to a non-die support.

A greater or lesser number of spacer elements may be required to provide adequate support, depending for example upon the flexibility of the die (thinner die may require more support) and upon the height of the stack and the number of die in the stack.

The spacer elements may be, for example, glass or nonconductive polymer spheres; and they may be scattered over the surface of each die. Or, for example, the spacers may be small polymer dots, which may be adhesive to some extent (they may be a polymer adhesive, for example an epoxy) to affix the adjacent die temporarily, so that the die in the stack do not shift during processing steps leading up to the completion of the conformal coating over the stack; and they may be printed (for example screen printed or mask printed) onto the die surface, or dispensed onto the die surface using a needle or nozzle, for example.

As may be appreciated, to obtain adhesion of a die to a support, whether the support be another die, a substrate, a motherboard, or other surface, the coating need be situated only within an area where contact of the surface of the coated die and the surface of the substrate is expected. For example, where the backside of the coated die contacts a surface of the substrate, for adhesion purposes the coating may be only within the die attach area of the die.

The support may include a patterned metal layer at the die mount side, as shown by way of example in FIGS. 6, 7, 10B and 11B. Where no uncoated die surface contacts the surface of the substrate, the dielectric layer over the patterned metal layer (e.g. 13, 103, 113) is not required, as the dielectric properties of the conformal coating prevents shorting of the die and the circuitry on the substrate.

In the illustrated examples of assemblies having two or more die stacked die interconnected by electrically conductive polymer traces, the die are shown as having the same width (in the sectional view shown), and the die are arranged in the stack so that the die sidewalls in overlying die are generally vertically aligned. That is, the resulting die stack assemblies present a generally planar stack face for interconnection. In other embodiments, not all the die in the stack need have the same dimensions, and the die sidewalls adjacent the interconnects may be arranged so that they are not vertically aligned. For example, the die in the stack may be offset, or may be staggered. Examples of various die stacking configurations are shown in S. J. S. McElrea et al. U.S. application Ser. No. 12/124,077, referenced above.

Examples of various electrically conductive polymer interconnect materials, and techniques for applying interconnect traces onto a variety of stacked die assembly configurations, are described for example in T. Caskey et al. U.S. application Ser. No. 12/124,097, titled "Electrical interconnect formed by pulsed dispense", which was filed May 20, 2008, and which is hereby incorporated herein by reference.

Other embodiments are contemplated by the invention. For example, the die may be interconnected by tab bonds, for example, or by ribbon bonds configured as off-die interconnects. Where "vertical" interconnection is employed, for example using an electrically conductive epoxy trace, adjacent die in the stack may be offset. An offset arrangement may be particularly useful where the die pads or interconnects are situated in the active surface of the die and are accordingly would not be presented at the face of the die stack for interconnection. A stack of several offset die may have a stairstep appearance, for example.

All patents and patent applications referred to above are hereby incorporated by reference herein.

We claim:

1. A method for affixing a die onto a support, comprising: placing the die onto the support; providing a standoff between a die attach surface of the die and a die mount surface of the support; and conformally coating to coat at least the die attach surface of the die and the die mount surface of the support including forming a polymer in situ with vapor deposition in a space between the die attach surface of the die and the die mount surface of the support.

2. The method of claim 1, wherein the polymer includes an organic polymer on the die attach surface of the die and the die mount surface of the support.

3. The method of claim 1, wherein the polymer includes a p-xylene or a derivative thereof on the die attach surface of the die and the die mount surface of the support.

4. The method of claim 1, wherein the polymer includes a polyxylylene polymer on the die attach surface of the die and the die mount surface of the support.

5. The method of claim 1, wherein the polymer includes a parylene selected from the group consisting of a parylene C, a parylene N, a parylene A, a parylene SR on the die attach surface of the die and the die mount surface of the support.

6. The method of claim 1, further comprising: differentially cooling the die attach surface of the die and the die mount surface of the support.

7. A method for affixing a die onto a support, comprising: placing the die onto the support; providing a standoff with dielectric spacers between a die attach surface of the die and a die mount surface of the support; and conformally coating to coat at least the die attach surface and the die mount surface, wherein the conformally coating comprises forming a polymer in situ with vapor deposition in a space between the die attach surface of the die and the die mount surface of the support.

8. The method of claim 7, wherein the polymer includes an organic polymer on the die attach surface of the die and the die mount surface of the support.

9. The method of claim 7, further comprising: differentially cooling the die attach surface of the die and the die mount surface of the support.

10. The method of claim 7, wherein the dielectric spacers provide adhesion between the die and the support for the conformally coating.

11. The method of claim 7, wherein the dielectric spacers comprise a glass or an organic polymer.

12. The method of claim 7, wherein the dielectric spacers have a nominal height in a range of about 5 μm to about 40 μm.

13. The method of claim 7 further comprising: selectively removing portions of a passivation layer and leaving spots of the passivation layer to serve as the dielectric spacers, wherein the passivation layer covers at least an active surface of the die.

14. A method for affixing a die onto a support, comprising: placing the die onto the support; providing a standoff between a die attach surface of the die and a die mount surface of the support; and a conformally coating to coat at least the die attach surface and the die mount surface, wherein the conformally coating comprises forming a polymer in situ with vapor deposition to fill a gap between the die attach surface of the die and the die mount surface of the support.

15. The method of claim 14, wherein the polymer includes a p-xylene or a derivative thereof on the die attach surface of the die and the die mount surface of the support.

16. The method of claim 14, wherein the polymer includes an organic polymer on the die attach surface of the die and the die mount surface of the support.

17. The method of claim 14, further comprising: differentially cooling the die attach surface of the die and the die mount surface of the support.

* * * * *